United States Patent [19]
Baraszu

[11] Patent Number: 5,371,695
[45] Date of Patent: Dec. 6, 1994

[54] METHOD FOR AUTOMATICALLY CONTROLLING THE BANDWIDTH OF A DIGITAL FILTER AND ADAPTIVE FILTER UTILIZING SAME

[75] Inventor: Robert C. Baraszu, Dearborn, Mich.

[73] Assignee: Ford Motor Company, Dearborn, Mich.

[21] Appl. No.: 136,065

[22] Filed: Oct. 14, 1993

[51] Int. Cl.$^5$ ............................................. G06F 15/31
[52] U.S. Cl. .................................................. 364/724.19
[58] Field of Search ...................... 364/724.19, 724.01, 364/807; 395/3, 900

[56] References Cited

U.S. PATENT DOCUMENTS

| | | |
|---|---|---|
| 3,889,108 | 6/1975 | Cantrell . |
| 5,201,062 | 4/1993 | Nakamura et al. ................ 395/900 |
| 5,212,764 | 5/1993 | Ariyoshi .............................. 395/2 |
| 5,263,184 | 11/1993 | Nakamura et al. ................ 395/900 |

*Primary Examiner*—Tan V. Mai
*Attorney, Agent, or Firm*—Roger L. May; Richard D. Dixon

[57] ABSTRACT

A method and an adaptive filter are provided wherein the bandwidth of the filter is varied as a function of current and past input signal values based on the amount of noise judged to be present. A first order digital low pass filter is described by the following equation:

$$y(k)=\alpha(x(k)+(k+1))+(1-2\alpha)y(K-1)$$

where $\alpha$ is a variable control signal which controls the cutoff frequency of the filter. Fuzzy logic or rules are used to determine $\alpha$. To determine whether the current input signal is most likely a true signal or noise, three differences are taken between the current and past three input sample signals. Based on a comparison of these differences, $\alpha$ is assigned a value from 0.0 to 0.5 in accordance with the fuzzy rules. If the rules indicate that noise is predominant, the bandwidth of the filter is minimized by setting $\alpha=0.0$ to suppress the noise. If the fuzzy rules indicate that the current input signal is valid, then the bandwidth of the filter is maximized by setting $\alpha=0.5$. Values of $\alpha$ between 0.0 and 0.5 reflect an indeterminate judgment by the fuzzy rules.

16 Claims, 4 Drawing Sheets

METHOD FOR AUTOMATICALLY CONTROLLING THE BANDWIDTH OF A DIGITAL FILTER AND ADAPTIVE FILTER UTILIZING SAME

TECHNICAL FIELD

This invention relates to methods for automatically controlling the bandwidth of a digital filter and adaptive filters and, in particular, to such methods and adaptive filters which utilize fuzzy logic or inferencing.

BACKGROUND ART

Considerable attention has been directed toward the development of various types of filters, and especially toward adaptive filters. An adaptive filter is intended to do what its name implies. It is a filter which filters an incoming signal but which adapts or changes its filtering characteristics in accordance with a change of some condition, usually related to the signal being filtered.

There exist many adaptive filter designs, as for example the Kalman filter (based upon what is known as the least mean square criterion), the phase-locked loop, and the adaptive array antenna. Each of these adaptive filters is suited to a particular class of problems. For example, the phase-locked loop adaptively adjusts the frequency of oscillation, and an adaptive antenna places nulls in an antenna pattern to reject sidelobe interference in a changing interfering environment.

The U.S. Pat. No. 3,889,108 to Cantrell, discloses an adaptive filter which is suited for a special class of problems which generally relate to the filtering of a signal to remove higher-order frequency components. It is desirable to remove these high frequency components when they are not related to the true signal but are part of signal noise which causes interference and tends to mask the true signal.

The Cantrell patent discloses an adaptive digital low-pass filter which adaptively changes its bandwidth filtering characteristics in accordance with the bandwidth of the incoming signal. The filter cutoff point may be increased to a higher frequency, or decreased to a lower frequency, by using prior signal inputs and outputs of the filter.

As shown in FIG. 3 of the Cantrell patent, the filter 20 receives an input signal w(k) and outputs an output signal x(k). The operation of the filter is represented by the equation $x(k)=w(k)[1-1(k)]+a(k)x(k-1)$, shown within the filter block 20, where a(k) is an adaptive error signal based on the noise level in the signal. When the noise level increases, a(k) approaches 1.0, and the output signal $x(k)=x(k-1)$. Thus, the immediate past filter output signal is taken as the current filter output signal. Also, as described beginning at column 5, line 55, when there is little noise present, a(k) becomes small, and the input value w(k) appears at the output x(k).

Thus, the Cantrell patent broadly discloses an adaptive digital filter which varies the bandwidth based on prior signal inputs and outputs of the filter while estimating the noise level present in the signal.

In general, fuzzy logic provides procedures to incorporate knowledge expressed vaguely and yet arrive at a definite, calculable answer. In other words, fuzzy logic is a methodology for handling knowledge that contains some uncertainty or vagueness. The foundations of fuzzy logic were set forth in the 1960s by L. A. Zadeh in his paper entitled "Fuzzy Sets", INFORM. CONTR., 8 pp. 338-353, 1965.

In current engineering application, fuzzy logic is most often found in control problems in the form of a particular procedure, called "max-min" fuzzy inference as described by Ebrahim Mamdani in his paper entitled "Application of Fuzzy Logic to Approximate Reasoning Using Linguistic Synthesis", IEEE TRANSACTIONS ON COMPUTERS, (1977) C-26, No. 12, pp. 1182-1191. This procedure incorporates approximate knowledge of approximate control response for different circumstances into sets of rules for calculating a particular control action. The rules are expressed in terms of "IF (situation holds), THEN (take consequent control action). The degree to which a particular consequent action is taken depends on the degree to which its corresponding conditions hold. The linguistic expression of a situation or consequent control action is translated into a definite calculation via specified membership functions. A membership function quantifies what is meant by a phrase such as "The temperature is high" by defining the degree of membership in the class, "high", depending on the value of the input variable, temperature.

SUMMARY OF THE INVENTION

An object of the present invention is to provide a method for automatically controlling the bandwidth of a digital filter by utilizing fuzzy rules in order to discriminate between signal and noise wherein filter bandwidth is varied in real time to achieve good transient response and good noise suppression.

Another object of the present invention is to provide an adaptive filter including a digital filter wherein fuzzy logic or rules are utilized to discriminate between signal and noise and the bandwidth of the digital filter is varied in real time to achieve good transient response and good noise suppression.

Still another object of the present invention is to provide an adaptive filter which combines fast response time with high noise suppression which approaches an ideal filter, especially in real-time control applications, such as engine control, to achieve smoother, more accurate performance.

In carrying out the above objects and other objects of the present invention a method is provided for automatically controlling the bandwidth of a digital filter in response to changes of condition of an input signal to the digital filter. The method includes the steps of defining fuzzy rules between the changes of condition of the input signal and a control signal to the digital filter and modifying the control signal based on the changes of condition and the fuzzy rules. The method also includes the step of utilizing the modified control signal to control the bandwidth of the digital filter in real time so that the digital filter achieves good transient response and noise suppression.

Further in carrying out the above object and other objects of the present invention an adaptive filter is provided which has a bandwidth responsive to changes of condition of an input signal. The adaptive filter includes a digital filter and means for defining fuzzy rules between the changes of condition of the input signal and a control signal to the digital filter. The adaptive filter also includes means for modifying the control signal based on the changes of condition and the fuzzy rules. The modified control signal controls the bandwidth of the digital filter in real time so that the digital filter achieves good transient response and noise suppression.

Preferably, the input signal is generated by an automotive vehicle sensor such as a mass airflow sensor.

These and other objects and advantages of the present invention will be readily apparent from the following detailed description of the best mode for carrying out the invention when read in connection with the accompanying drawings.

BEST MODE FOR CARRYING OUT THE INVENTION

Figure 1:
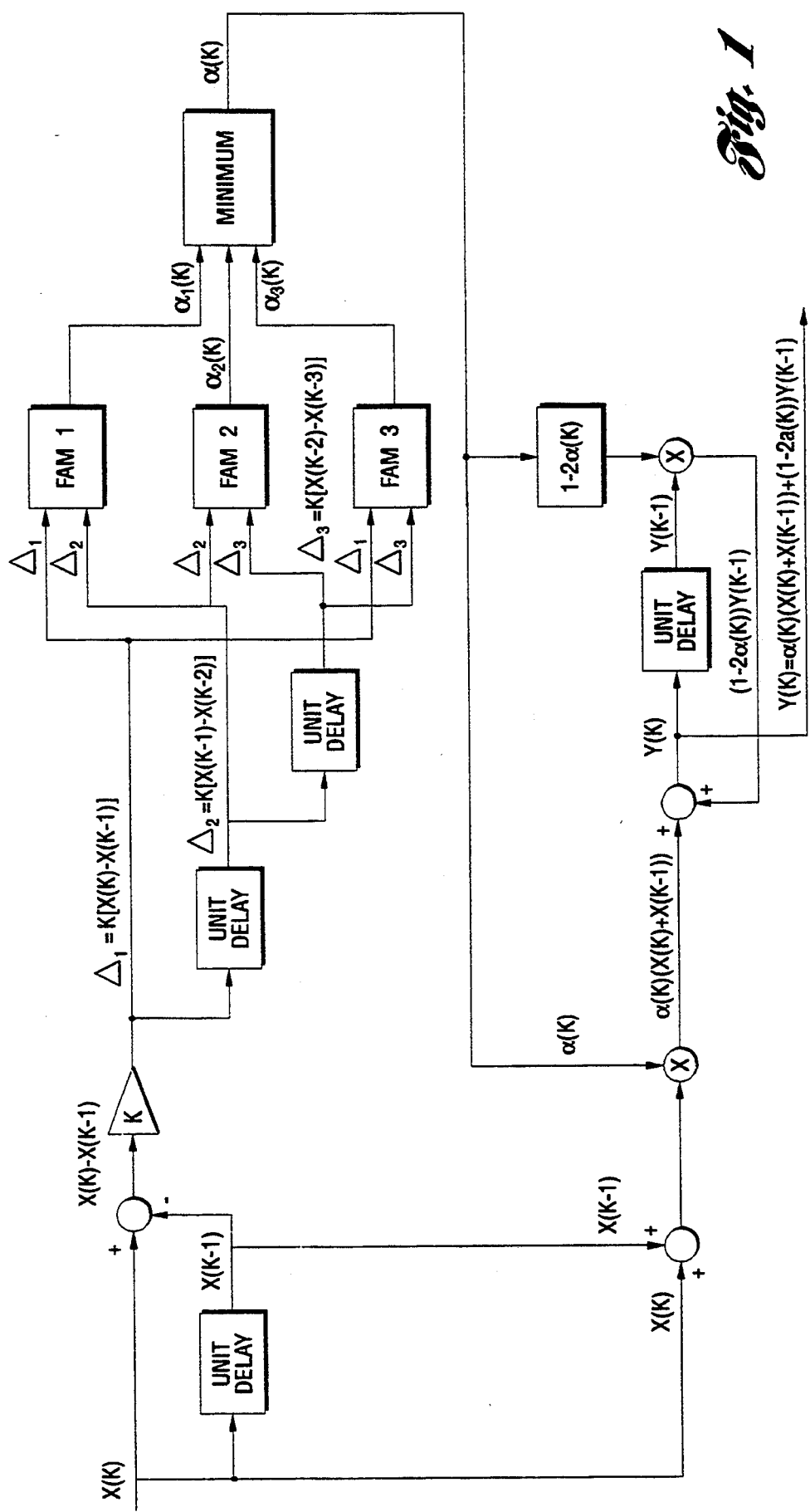
FIG. 1 is a flow diagram of low pass filter constructed in accordance with the present invention.
Figure 2:
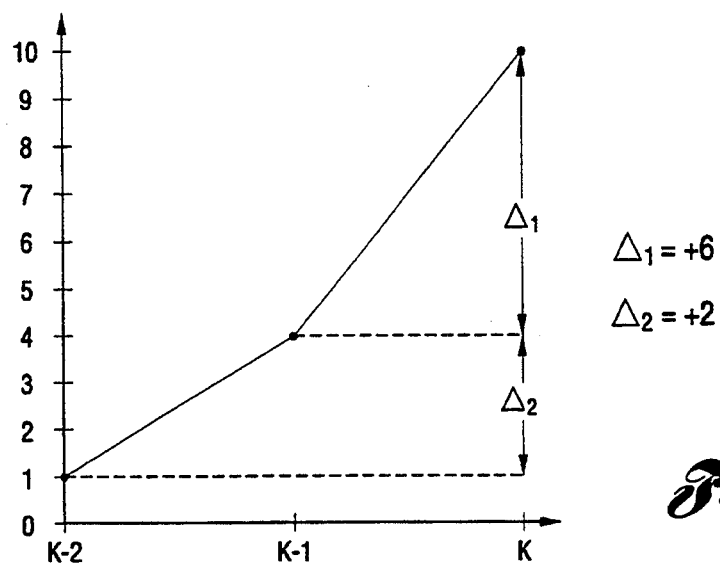
FIG. 2 is a graph of an input signal at various sample times wherein the filter is required to have only a single fuzzy associate memory (FAM)
Figure 3:
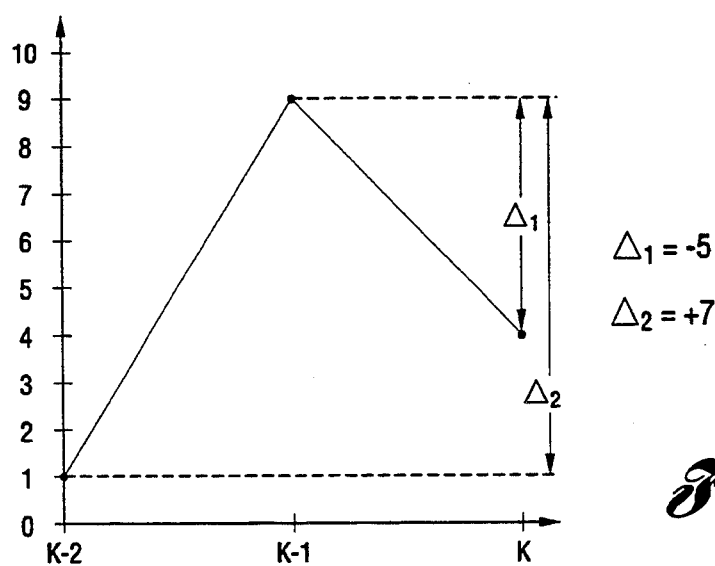
FIG. 3 is a graph of another input signal at various sample times.
Figure 8:
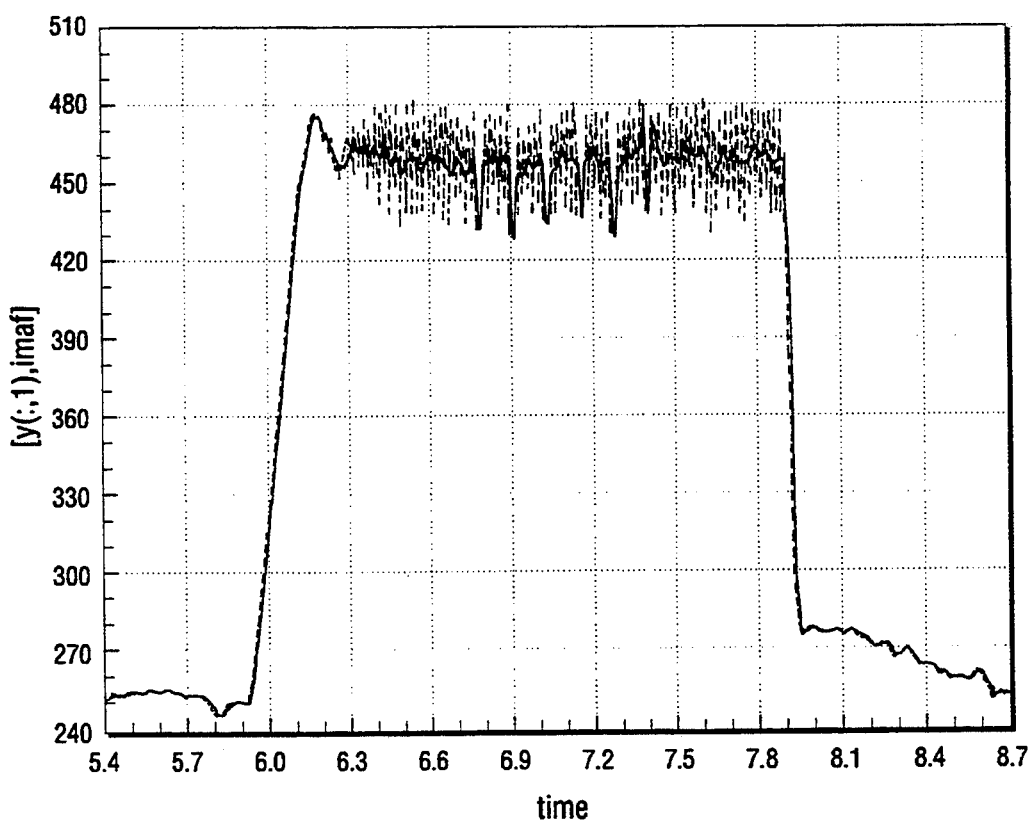
FIGS. 8 and 9 are graphs illustrating different filter responses dependent on the contents of different FAMs.
Figure 9:
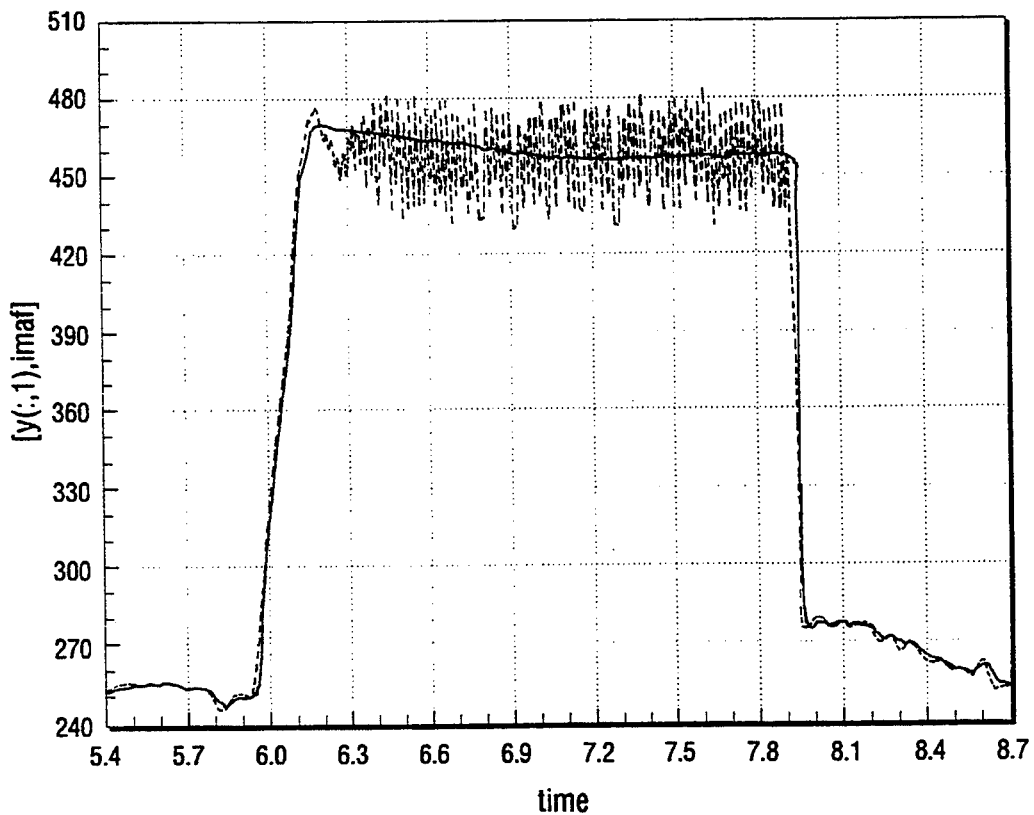

The method and adaptive filter of the present invention is described with reference to a first-order lowpass filter, as illustrated in FIG. 1. However, the method proposed herein can be applied to higher order filters as well. In addition, high pass filters, or differentiators, can also be constructed by this method. For sake of example, the filter has been applied to a real signal from a mass air flow sensor, as illustrated in FIGS. 8 and 9.

By way of background, a first-order digital lowpass filter is described by the following difference equation:

$$y(k) = \alpha(k)(x(k) + x(k-1)) + (1 - 2\alpha(k))y(k-1)$$

where $x(k)$ is the input signal at time $t = k$
$x(k-1)$ is the input signal at time $t = k-1$
$x(k-2)$ is the input signal at time $t = k-2$
$x(k-3)$ is the input signal at time $t = k-3$
$y(k)$ is the filter output signal at time $t = k$
$y(k-1)$ is the filter output signal at time $t = k-1$
$\alpha(k)$ is the filter bandwidth at time $t = k$ In a standard digital filter, $\alpha(k)$ is constant for all k and, therefore, the cutoff frequency or bandwidth of the filter is constant.

For purposes of the present invention, the value of $\alpha(k)$ can range from 0.0 to 0.5 and can be thought of as the degree of belief that the input signal $x(k)$ is part of the "real" signal as opposed to just noise. Values of $\alpha(k)$ near 0.0 indicate the least belief that the input is part of the signal. The signal is, therefore, heavily filtered to suppress the noise. However, the filter is also slow to respond to real changes in the signal.

On the other hand, $\alpha(k)$ near 0.5 allows almost all of the input signal to be passed through the filter, be it a real signal or noise. In this case, the filter responds quickly to changes in the real signal, as desired, but also passes the noise. An ideal filter would follow the signal but suppress the noise.

The method and adaptive filter of the present invention in general uses linguistic, fuzzy rules to vary $\alpha(k)$ in real-time as a function of the current value of the input signal and some past input values. The rules are established based on expert knowledge of what the real signal looks like if no noise is present. Thus, both properties of the signal and properties of the noise that corrupts the signal should be known. These properties include expected magnitude and frequency of signal and noise.

The filtering technique of the present invention uses the following measures as the inputs to a fuzzy knowledge base, or Fuzzy Associative Memory (FAM):

$\Delta_1 = x(k) - x(k-1)$: The difference between the signal at time $t = k$ and at $t = k-1$ $\Delta_2 = x(k-1) - x(k-2)$: The difference between the signal at time $t = k-1$ and at $t = k-2$ $\Delta_3 = x(k-2) - x(k-3)$: The difference between the signal at time $t = k-2$ and at $t = k-3$ Relationships between $\Delta_1$ and $\Delta_2$, and $\Delta_2$ and $\Delta_3$, and $\Delta_1$ and $\Delta_3$, are used to determine the validity of the current input signal $x(k)$: is $x(k)$ most likely signal or noise given the current and past three samples?

For instance, if both $\Delta_1$ and $\Delta_2$ are large and positive then the past two movements are of similar magnitude and in the same direction. Therefore $\alpha(k)$ is assigned a value indicating a high degree of belief that $x(k)$ is signal rather than noise.

On the other hand, if $\Delta_1$ is large and negative but $\Delta_2$ is large and positive, then $\alpha(k)$ is assigned a value indicative of a low degree of belief that $x(k)$ is signal. The input is judged to be changing too drastically in both frequency and magnitude, over the past two samples to be a real change in the signal; therefore, $x(k)$ is likely to be noise and is suppressed. This results in two generalized fuzzy rules:

(1) "if the last two changes of the input are in the same direction, then the input is probably signal; therefore, increase filter bandwidth."

(2) "If the last two changes of the input are in opposite directions, then the input is probably noise; therefore, decrease filter bandwidth."

In one embodiment of the invention, three FAMs are used to evaluate the degree of belief that $x(k)$ is a valid signal, as illustrated in FIG. 1. FAM1 uses $\Delta_1$ and $\Delta_2$ as inputs; the output is the degree of belief value, $\alpha_1(k)$. Similarly, FAMs 2 and 3 use $\Delta_2$ and $\Delta_3$ and $\Delta_1$ and $\Delta_3$, respectively, as inputs and produce $\alpha_2(k)$ and $\alpha_3(k)$ as outputs. The minimum, or most conservative value of $\alpha_1(k)$, $\alpha_2(k)$, and $\alpha_3(k)$ is the final degree of belief, $\alpha(k)$.

Heuristically, FAM1 judges the reasonableness of $x(k)$ based on the last two changes in the input $\Delta_1$ and $\Delta_2$; FAM2 the reasonableness based on $\Delta_2$ and $\Delta_3$; and FAM3 on $\Delta_1$ and $\Delta_3$. Thus, if all three FAMs judge that $x(k)$ is valid, then the bandwidth of the filter can be maximized ($\alpha(k) = 0.5$) since there is no noise that need be suppressed. If all three FAMs rule that $x(k)$ is noise, then the bandwidth of the filter is minimized ($\alpha(k) = 0.0$) to maximally suppress the noise. In cases where the validity of $x(k)$ is unclear, the FAMs provide a fuzzy means for judging the degree to which $x(k)$ is signal or noise and adjusting the bandwidth ($0.0 < \alpha(k) < 0.50$) in such a way as to obtain the desired response, as determined by a human expert.

TABLE 1

FUZZY ASSOCIATIVE MEMORY: FAM 1
$\Delta_1 = x(k) - x(k-1)$

| $\Delta_2$ | Negative Large | Negative Small | Zero | Positive Small | Positive Large |
| --- | --- | --- | --- | --- | --- |
| Negative Large | 0.5 | 0.25 | 0.0 | 0.0 | 0.0 |
| Negative Small | 0.25 | 0.125 | 0.0 | 0.0 | 0.0 |
| Zero | 0.0 | 0.0 | 0.0 | 0.0 | 0.0 |
| Positive Small | 0.0 | 0.0 | 0.0 | 0.125 | 0.25 |
| Positive Large | 0.0 | 0.0 | 0.0 | 0.25 | 0.5 |

For most filtering needs, FAM1=FAM2=FAM3. However, certain applications may require differences between the three FAMs to achieve the desired performance. A typical FAM is shown in Table 1. The cell values indicate the degree of belief that the current input is valid signal. A value of 0.0 means that x(k) is regarded as noise, where a value of 0.5 means that x(k) is valid signal. Values between 0.0 and 0.5 represent varying degrees of signal/noise mixing. The magnitude and direction of $\Delta_1$, $\Delta_2$, and $\Delta_3$ are represented linguistically as Positive Large, Positive Small, Zero, Negative Small, and Negative Large.

The numerical values associated with the linguistic variables depend on the characteristics of the signal being filtered, on the noise, and on the desired filter response. For instance, if the input signal is bounded between −1.0 and 1.0 then the numerical values corresponding to the linguistic variables may be as shown in Table 2. However, other mappings are possible to fit the application.

TABLE 2

Positive Large=1.0
Positive Small=0.5
Zero=0.0
Negative Small=−0.5
Negative Large=−1.0

Figure 4:
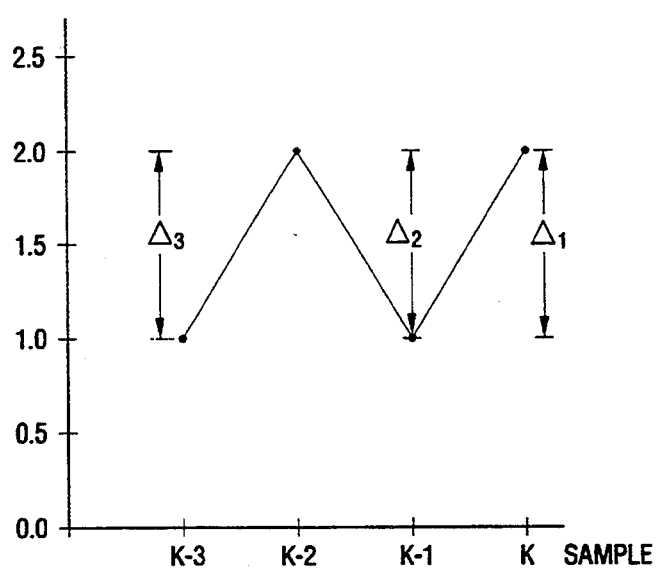
FIG. 4 is a graph of an input signal to the filter of FIG. 1 at various sample times.
Figure 5:
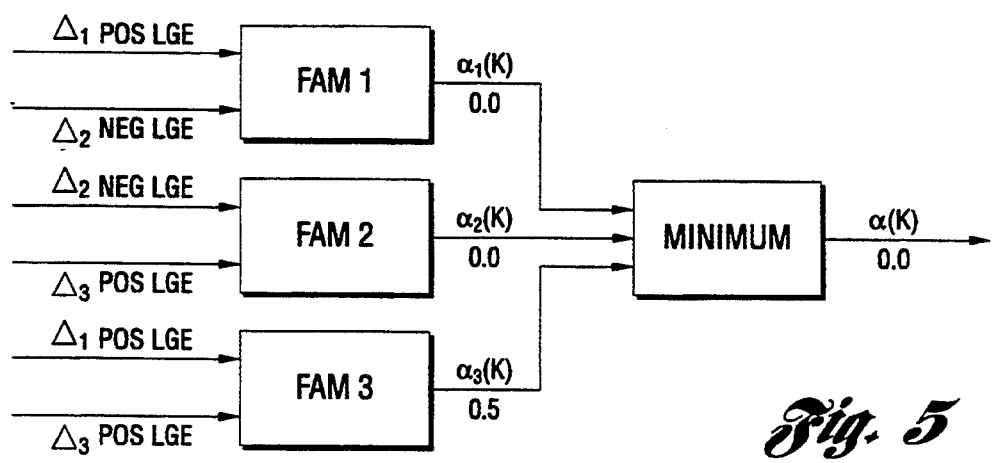
FIG. 5 is a portion of the flow diagram of FIG. 1 having various inputs and outputs corresponding to the graph of FIG. 4.

FIGS. 4 and 5 illustrate an example rule 1 wherein the filter bandwidth is a function of the current and last three inputs as follows:

"If $\Delta_1$ is Positive Large and $\Delta_2$ is Negative Large and $\Delta_3$ is Positive Large, then x(k) is probably noise; set $\alpha(k)$ near zero"

$\Delta_1 = x(k) - x(k-1) = 1.0$ [positive large]
$\Delta_2 = x(k-1) - x(k-2) = -1.0$ [negative large]
$\Delta_3 = x(k-2) - x(k-3) = 1.0$ [positive large]

Figure 6:
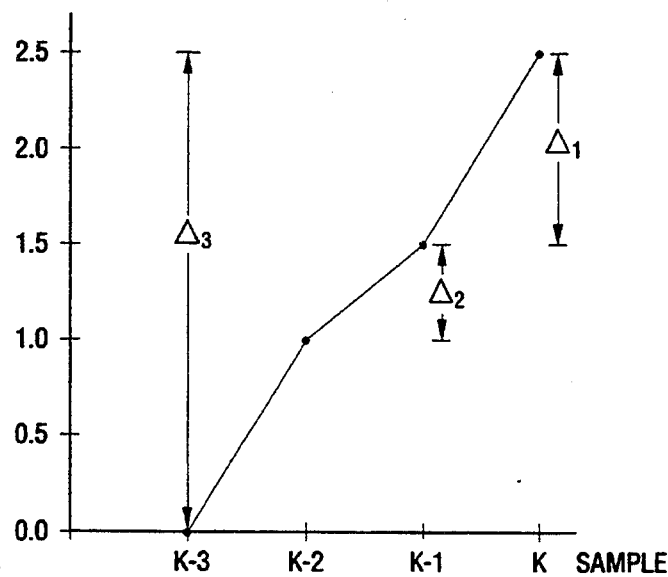
FIG. 6 is a graph of another input signal to the filter at various sample times.
Figure 7:
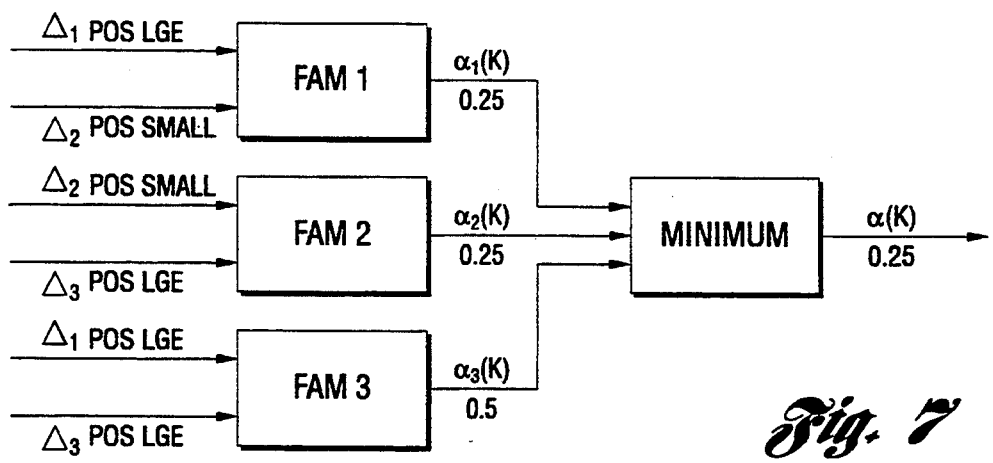
FIG. 7 is the same portion of the flow diagram of FIG. 5 having inputs and outputs corresponding to the graph of FIG. 6.

FIGS. 6 and 7 illustrate an example rule 2 again wherein filter bandwidth is a function of the current and last three inputs as follows:

"If $\Delta_1$ is Positive Large and $\Delta_2$ is Positive Small and $\Delta_3$ is Positive Large, then x(k) is probably signal; set e (k) high"

$\Delta_1 = x(k) - x(k-1) = 1.0$ [positive large]
$\Delta_2 = x(k-1) - x(k-2) = +0.5$ [positive small]
$\Delta_3 = x(k-2) - x(k-3) = 1.0$ [positive large]

FIGS. 8 and 9 show how alteration of the FAMs can produce drastically different filter responses. It is up to expert judgment to decide which FAM produces the most appropriate response for a particular application.

While the best mode for carrying out the invention has been described in detail, those familiar with the art to which this invention relates will recognize various alternative designs and embodiments for practicing the invention as defined by the following claims.

I claim:

1. A method for automatically controlling the bandwidth of a digital filter in response to changes of condition of an input signal to the digital filter, the method comprising the steps of:
   determining changes of condition of the input signal;
   defining fuzzy rules between the changes of condition of the input signal and a control signal;
   modifying the control signal based on the changes of condition and the fuzzy rules; and
   utilizing the modified control signal to control the bandwidth of the digital filter in real time so that the digital filter achieves good transient response and noise suppression.

2. The method of claim 1 wherein the input signal is a mass airflow signal.

3. The method of claim 1 wherein the changes of condition include two consecutive changes in the value of the input signal.

4. The method of claim 1 wherein the changes of condition includes three consecutive changes in the value of the input signal.

5. The method of claim 1 wherein the changes in condition include a change in frequency of the input signal.

6. The method of claim 1 wherein the changes in condition include two consecutive changes in the value of the input signal and wherein the step of defining includes the steps of:
   defining a first fuzzy rule between a first pair of the three consecutive changes in the value of the input signal and a first intermediate control signal;
   defining a second fuzzy rule between a second pair of the three consecutive changes in the value of the input signal and a second intermediate control signal; and
   defining a control fuzzy rule between the first and second intermediate control signals and the control signal to the digital filter.

7. The method as claimed in claim 1 wherein the changes in condition include three consecutive changes in the value of the input signal and wherein the step of defining includes the steps of:
   defining a first fuzzy rule between a first pair of the three consecutive changes in the value of the input signal and a first intermediate control signal;
   defining a second fuzzy rule between a second pair of the three consecutive changes in the value of the input signal and a second intermediate control signal;
   defining a third fuzzy rule between a third pair of the three consecutive changes in the value of the input signal and a third intermediate control signal; and
   defining a control fuzzy rule between the first, second and third intermediate control signals and the control signal to the digital filter.

8. An adaptive filter having a bandwidth responsive to changes of condition of an input signal, the adaptive filter comprising:
   means for determining changes of condition of the input signal;
   a digital filter;
   means for defining fuzzy rules between the changes of condition of the input signal and a control signal; and means for modifying the control signal based on the changes of condition and the fuzzy rules wherein the modified control signal controls the bandwidth of the digital filter in real time so that the digital filter achieves good transient response and noise suppression.

9. The adaptive filter of claim 8 wherein the input signal is a mass airflow signal.

10. The adaptive filter of claim 8 wherein the digital filter is a lowpass filter.

11. The adaptive filter of claim 8 or claim 10 wherein the digital filter is a first order filter.

12. The adaptive filter of claim 8 wherein the changes of condition include two consecutive changes in value of the input signal.

13. The adaptive filter of claim 8 wherein the changes of condition include three consecutive changes in the value of the input signal.

14. The adaptive filter of claim 8 wherein the changes in condition include a change in frequency of the input signal.

15. The adaptive filter of claim 8 wherein the changes in condition include two consecutive changes in the value of the input signal and wherein the means for defining include:

means for defining a first fuzzy rule between a first pair of the three consecutive changes in the value of the input signal and a first intermediate control signal;

means for defining a second fuzzy rule between a second pair of the three consecutive changes of the value of the input signal and a second intermediate control signal; and means for defining a control fuzzy rule between the first and second intermediate control signals and the control signal to the digital filter.

16. The adaptive filter as claimed in claim 8 wherein the changes in condition include three consecutive changes in the value of the input signal and wherein the means for defining includes:

means for defining a first fuzzy rule between a first pair of the three consecutive changes in the value of the input signal and a first intermediate control signal;

defining a second fuzzy rule between a second pair of the three consecutive changes in the value of the input signal and a second intermediate control signal;

means for defining a third fuzzy rule between a third pair of the three consecutive changes in the value of the input signal and a third intermediate control signal; and defining a control fuzzy rule between the first, second and third intermediate control signals and the control signal to the digital filter.

* * * * *